United States Patent [19]

Fischer et al.

[11] Patent Number: 6,111,267

[45] Date of Patent: Aug. 29, 2000

[54] CMOS INTEGRATED CIRCUIT INCLUDING FORMING DOPED WELLS, A LAYER OF INTRINSIC SILICON, A STRESSED SILICON GERMANIUM LAYER WHERE GERMANIUM IS BETWEEN 25 AND 50%, AND ANOTHER INTRINSIC SILICON LAYER

[75] Inventors: Hermann Fischer; Franz Hofmann, both of Munich, Germany

[73] Assignee: Siemens Aktiengesellschaft, Munich, Germany

[21] Appl. No.: 09/071,153

[22] Filed: May 4, 1998

[30] Foreign Application Priority Data

May 13, 1997 [DE] Germany ............ 197 20 008

[51] Int. Cl.[7] .................... H01L 29/06
[52] U.S. Cl. ................. 257/19; 257/65; 257/617
[58] Field of Search .............. 257/19, 280, 281, 257/192, 274, 69, 197, 616

[56] References Cited

U.S. PATENT DOCUMENTS

| 4,994,866 | 2/1991 | Awano | 257/190 |
| 5,091,767 | 2/1992 | Bean et al. | 257/190 |
| 5,114,876 | 5/1992 | Weiner | 117/53 |
| 5,155,571 | 10/1992 | Wang et al. | 357/42 |
| 5,268,324 | 12/1993 | Aitken et al. | 438/217 |
| 5,534,713 | 7/1996 | Ismail et al. | |
| 5,686,744 | 11/1997 | Kovacic | 257/280 |
| 5,821,577 | 10/1998 | Crabbe' et al. | 257/288 |

FOREIGN PATENT DOCUMENTS

| 0 323 896 | 7/1989 | European Pat. Off. . |
| WO 97/23000 | 6/1997 | WIPO . |

OTHER PUBLICATIONS

IBM Technical Disclosure Bulletin, vol. 34, No. 10A, Mar. 1992.
K. Hoffmann, VLSI Entwurf, 1996, S. 333–339.
S. Sadek et al., Sol. St. El., vol. 38, 1995, S. 1731–1734.
K. Ismael, Int. School of mat. sci., Erice, Italy, 13–24–7.95, S 19–20.
U. Konig, 21. IFF–Ferienkurs, 5.–16.3.90, Kap 29.5.1.

*Primary Examiner*—Charles Bowers
*Assistant Examiner*—William M. Brewster
*Attorney, Agent, or Firm*—Hill & Simpson

[57] ABSTRACT

An integrated CMOS circuit, and method for producing same, including a semiconductor substrate having a p-channel MOS transistor and an n-channel MOS transistor formed therein and having a first silicon layer, a stressed $Si_{1-x}Ge_x$ layer and a second silicon layer which are preferably grown by selective epitaxy. In an ON state, a buried channel is formed in the stressed $Si_{1-x}Ge_x$ layer in the p-channel MOS transistor and a surface channel is formed in the second silicon layer in the n-channel MOS transistor.

1 Claim, 1 Drawing Sheet

CMOS INTEGRATED CIRCUIT INCLUDING FORMING DOPED WELLS, A LAYER OF INTRINSIC SILICON, A STRESSED SILICON GERMANIUM LAYER WHERE GERMANIUM IS BETWEEN 25 AND 50%, AND ANOTHER INTRINSIC SILICON LAYER

BACKGROUND OF THE INVENTION

1. Field of the Invention

The present invention relates, generally, to an integrated CMOS circuit design and, more specifically, to an integrated CMOS circuit in a semiconductor substrate having at least a first silicon layer, a stressed $Si_{1-x}Ge_x$ layer and a second silicon layer wherein both at least one p-channel MOS transistor and at least one n-channel MOS transistor are formed in the semiconductor substrate.

2. Description of the Prior Art

When structures are miniaturized by the principle of similar downscaling in MOS technology, the properties of MOS transistors and CMOS circuits are essentially preserved in the micrometer range. However, short-channel and punch-through effects occur in the case of MOS transistors having channel lengths of less than approximately 200 nm.

Although these effects can be compensated for, in part, by an increased doping of the substrate, such a high doping of the substrate leads, inter alia, to impairment of the charge carrier mobility in the channel. The impairment of the charge carrier mobility in the channel becomes particularly apparent in p-channel MOS transistors.

In CMOS circuit arrangements, particularly invertors, NAND and NOR gates, shift registers, memory, and logic and analogue circuits, use is made of both n-channel MOS transistors and p-channel MOS transistors which must have not only unit voltage equality in terms of magnitude but also the same transconductance and the same saturation current. It has been proposed (see, for example, K. Hoffman, VLSI-Entwurf Modelle und Schaltungen (VLSI Design Models and Circuits), $3^{rd}$ edition 1996, pages 333 to 339) to achieve the same transconductance and the same saturation current in otherwise identically constructed n-channel MOS transistors and p-channel MOS transistors by giving the channel of the p-channel MOS transistor a width-to-length ratio which is twice as great as that of the channel of the n-channel MOS transistor. This is intended to compensate for the hole mobility in the p-channel MOS transistor being less than, by a factor of 2, the electron mobility in the n-channel MOS transistor. However, the area and the stray capacitance in the p-channel MOS transistor are increased as a result of this measure.

A. Sadek et al., Solid-State Electronics, Vol. 38, No. 9, (1995), pages 1731 to 1734 and K. Ismael, Lecture at the International School of materials science and technology, Erice, Italy, Jul. 13, to 24, 1995, pages 19 to 20 have proposed increasing the hole mobility in the channel of a p-channel MOS transistor by providing a layer of stressed $Si_{1-x}Ge_x$ in the region of the channel. This layer is stressed by virtue of the fact that it has the lattice constant of monocrystalline silicon. The lattice in this layer is matched in the xy plane. For this reason, compressive stress exists in the x and y directions in the SiGe, while tensile stress is present in the z direction, which corresponds to the growth direction. One speaks of pseudomorphic layers in the context of heterostructures which are elastically stressed in this way. In order to produce a CMOS circuit, the p-channel MOS transistors are formed with a channel containing an $Si_{1-x}Ge_x$ layer and the n-channel MOS transistors are formed with a channel made of monocrystalline silicon. Two separate process blocks are required here in order to produce the p-channel MOS transistors and the n-channel MOS transistors.

SUMMARY OF THE INVENTION

The present invention is based on the problem of providing an integrated CMOS circuit which can be produced with a reduced space requirement and a reduced process outlay. Furthermore, the present invention provides a method for the production of such an integrated CMOS circuit.

The integrated CMOS circuit of the present invention is formed in a semiconductor substrate having at least a first silicon layer, a stressed $Si_{1-x}Ge_x$ layer and a second silicon layer. Both at least one p-channel MOS transistor and at least one n-channel MOS transistor are formed in the semiconductor substrate. The present invention utilizes the insight that a buried, conductive channel (so-called buried channel) is formed in the event of appropriate driving in p-channel MOS transistors, whereas in n-channel MOS transistors a conductive channel is formed along the surface of the substrate; that is, at the interface with the gate dielectric (so-called surface channel). In the CMOS circuit, the channel is formed within the $Si_{1-x}Ge_x$ layer in the region of the p-channel MOS transistors while the conductive channel is formed in the region of the second silicon layer in the region of the n-channel MOS transistors. As a result, the charge carrier mobility is determined by the $Si_{1-x}Ge_x$ layer in the region of the p-channel MOS transistors and by the second silicon layer in the region of the n-channel MOS transistors.

The higher hole mobility in the $Si_{1-x}Ge_x$ layer is exploited for the p-channel MOS transistor. A tensile stress is produced in the $Si_{1-x}Ge_x$ layer in the z direction in which the $Si_{1-x}Ge_x$ layer grows. This tensile stress in the z direction raises the band energy for heavy holes and changes the band dispersion at the T point in the plane perpendicular to the stress direction; that is, in the transport direction of the charge carrier in such a way that the band curvature becomes like that for light holes and the masses of the holes are thus reduced. In this way, the space required by the p-channel MOS transistors and n-channel MOS transistors is the same and, at the same time, equal transconductance and equal saturation currents are ensured. The p-channel MOS transistors and the n-channel MOS transistors can therefore be produced in one process sequence. The $Si_{1-x}Ge_x$ layer runs underneath the channel region of the n-channel MOS transistor and does not interfere with the functioning of the n-channel MOS transistor.

The germanium content of the $Si_{1-x}Ge_x$ layer preferably lies between 25 percent and 50 percent (x=0.25 to 0.50). The layer thickness of the stressed $Si_{1-x}Ge_x$ layer is preferably between 5 nm and 10 nm. The layer thickness of the first silicon layer, which is often referred to as a buffer layer and is arranged underneath the $Si_{1-x}Ge_x$ layer, is preferably between 30 nm and 70 nm. The layer thickness of the second silicon layer, which is often referred to as the cap layer, is preferably between 5 nm and 12 nm.

The first silicon layer, the stressed $Si_{1-x}Ge_x$ layer and the second silicon layer are formed by epitaxial growth on a main area of a semiconductor substrate which consists of silicon at least in the region of the main area. A suitable semiconductor substrate is either a monocrystalline silicon wafer, an SOI substrate or a substrate which consists of SiC in the region of the main area.

Preferably, insulation structures which define active regions for the n-channel MOS transistor and the p-channel MOS transistor are, first of all, formed on the main area. The first silicon layer, the stressed $Si_{1-x}Ge_x$ layer and the second silicon layer are then grown by selective epitaxy. This ensures that the stressed $Si_{1-x}Ge_x$ layer grows without any defects in the active regions.

Additional features and advantages of the present invention are described in, and will be apparent from, the Detailed Description of the Presently Preferred Embodiments and from the Drawings.

DETAILED DESCRIPTION OF THE PREFERRED EMBODIMENTS

Figure 1:
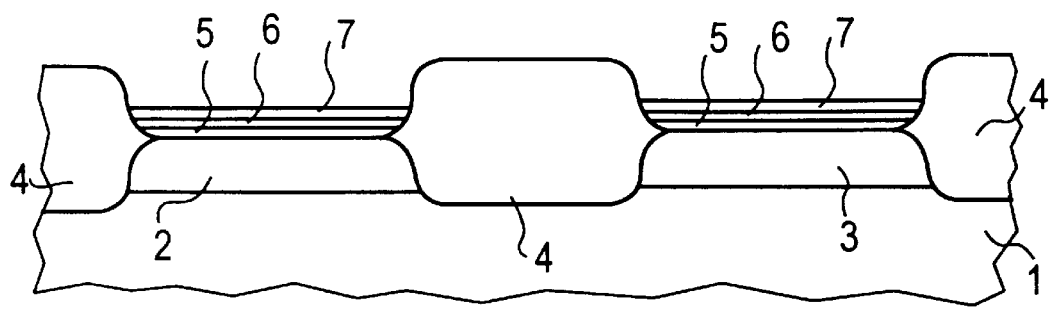
FIG. 1 shows a semiconductor substrate with insulation structures which define an active region for a p-channel MOS transistor and an active region for an n-channel MOS transistor after the epitaxial growth of a first silicon layer, a stressed $Si_{1-x}Ge_x$ layer and a second silicon layer.

As shown in FIG. 1, an n-doped well 2 is formed by masked implantation of arsenic with an energy of 180 keV and a dose of $4 \times 10^{13}$ cm$^{-2}$ in a substrate 1 made of p-doped monocrystalline silicon, for example, with a basic doping level corresponding to a resistivity of 5 $\Omega$cm. A p-doped well 3 is subsequently formed by masked implantation of boron. The boron is implanted at an energy of 50 to 70 keV with a dose of 1 to 2 $10^{13}$ cm$^{-2}$.

An insulation structure 4 is subsequently formed in a LOCOS process, for example, wherein the structure defines an active region for a p-channel MOS transistor in the region of the n-doped well 2 and an active region for an n-channel MOS transistor in the region of the p-doped well 3. Alternatively, the insulation structures 4 can be formed by filling trenches with insulating materials in a shallow trench insulation process. The insulation structures 4 reach down to the substrate 1 below the n-doped well 2 and the p-doped well 3.

A first silicon layer 5 is subsequently grown by means of selective epitaxy using a process gas containing $SiH_2Cl_2$. The first silicon layer 5, which is often referred to as a buffer layer, is grown to a layer thickness of 30 to 70 nm. The first silicon layer 5 is p-doped in order to set the threshold voltages of the n-channel MOS transistors and p-channel MOS transistors to be produced later. For this purpose, borane ($B_2H_6$) is added to the process gas until a layer thickness of 15 to 25 nm is reached. The first silicon layer 5 is then grown without doping by an additional 10 to 50 nm in the absence of borane. The process temperature during the growth of the first layer 5 is between 750 and 850° C.

An $Si_{1-x}Ge_x$ layer 6 is subsequently grown by means of selective epitaxy using a process gas containing $GeH_4$ at a process temperature of between 550 and 700° C. The $Si_{1-x}Ge_x$ layer 6 is formed to a layer thickness of 10 nm, for example, with a germanium content x of 0.25. The $Si_{1-x}Ge_x$ layer 6 may alternatively be formed to a layer thickness of 5 nm together with a germanium content x of 0.5.

The second silicon layer 7, which is often referred to as a cap layer, is subsequently grown by means of selective epitaxy using a process gas containing $SiH_2Cl_2$ without doping to a layer thickness of 5 to 12 nm. The temperature in this case is between 550 and 700° C.

Figure 2:
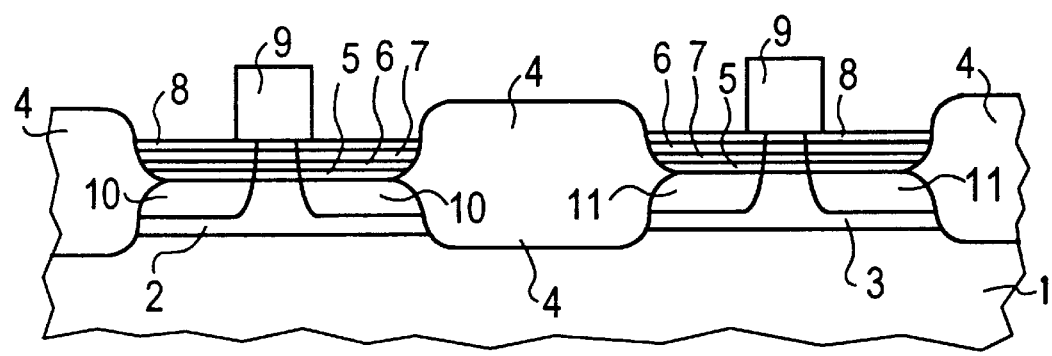
FIG. 2 shows the semiconductor substrate of FIG. 1 after the formation of the gate dielectric, gate electrodes and source-drain regions.

A gate dielectric 8 made of $SiO_2$ is subsequently formed by means of thermal oxidation at 750° C. for 120 minutes. The gate dielectric 8 is formed to a layer thickness of, for example, 4.5 nm (see FIG. 2). About 2 nm of the Si of the second silicon layer 7 are consumed during this oxidation. This use of the second silicon layer 7 therefore makes it possible to form the gate dielectric 8 by oxidizing silicon. Silicon oxide produced in this way is preferable to the oxide of SiGe owing to its better durability.

A gate electrode 9 is formed in each case for the p-channel MOS transistor and the n-channel MOS transistor by depositing and structuring an n$^+$-doped polysilicon layer. p-doped source/drain regions 10 are subsequently formed for the p-channel MOS transistor by masked implantation using boron and/or $BF_2$ with an energy of 20 to 30 keV and a dose of 4 to $8 \times 10^{15}$ cm$^{-2}$. n-doped source/drain regions 11 are formed for the n-channel MOS transistor in further masked implantation using arsenic at an energy of 100–130 keV with a dose of $4-8 \times 10^{15}$ cm$^{-2}$.

As a result of the temperature loads in the process cycle, the boron doping extends in the first silicon layer and contributes to the doping in the surface region. In this way, a sufficiently high doping in the surface region is obtained for the n-channel MOS transistor.

In order to optimize the transistor properties, the p-doped source/drain regions 10 and the n-doped source/drain regions 11 may be respectively provided with an LDD profile and an HDD profile in a known manner in two-stage implantation. The CMOS circuit arrangement is completed in a known manner by depositing a passivation layer, opening contact holes and forming a metallization layer (not illustrated in detail).

The n-doped well 2 and the p-doped well 3 are formed with a maximum dopant concentration of $1.5 \times 10^{18}$ cm$^{-3}$ in each case. This high dopant concentration prevents a punch-through effect. This high dopant concentration is permissible in the circuit because the n-doped well and the p-doped well 3 were produced before the epitaxy and, consequently, the heavy doping does not reach as far as the interface with the gate dielectric 8.

In the CMOS circuit arrangement described, a buried conductive channel is formed within the $Si_{1-x}GE_x$ layer 6 in the p-channel MOS transistor arranged in the n-doped well 2, given the application of appropriate control signals. In the n-channel MOS transistor arranged in the p-doped well 3, on the other hand, a conductive channel is formed on the surface of the second silicon layer 7, if driven appropriately.

Although the present invention has been described with reference to specific embodiments, those of skill in the art will recognize that changes may be made thereto without departing from the spirit and scope of the invention as set forth in the hereafter appended claims.

We claim as our invention:

1. An integrated CMOS circuit, comprising a semiconductor substrate including at least a first silicon layer having a thickness of between 30 nm and 70 nm, a stressed $Si_{1-x}Ge_x$ layer having a thickness of between 5 nm and 10 nm and a germanium content of between 50 atomic percent and 25 atomic percent and a second silicon layer having a thickness of between 5 nm and 12 nm, wherein the stressed $Si_{1-x}Ge_x$ layer has a lattice constant which is substantially equal to respective lattice constants of both the first silicon layer and the second silicon layer, wherein a p-channel MOS transistor and an n-channel MOS transistor are formed in the semiconductor substrate wherein a conductive channel is formed within the $Si_{1-x}Ge_x$ layer in the p-channel MOS transistor, and wherein a conductive channel is formed in the second silicon layer in the n-channel MOS transistor.

* * * * *